(12) United States Patent
Wasko et al.

(10) Patent No.: US 12,483,261 B2
(45) Date of Patent: Nov. 25, 2025

(54) SOFTWARE-DEFINED SIGNAL DEVICE SYSTEMS

(71) Applicant: Mellanox Technologies, Ltd., Yokneam (IL)

(72) Inventors: Wojciech Wasko, Mlynek (PL); Mathias Blake, Saratoga, CA (US); Dotan David Levi, Kiryat Motzkin (IL); Adam Thompson, Alexandria, VA (US); Dimitris Syrivelis, Volos (GR); Paraskevas Bakopoulos, Argiroupoli (GR)

(73) Assignee: Mellanox Technologies, Ltd., Yokneam (IL)

(*) Notice: Subject to any disclaimer, the term of this patent is extended or adjusted under 35 U.S.C. 154(b) by 367 days.

(21) Appl. No.: 18/101,675

(22) Filed: Jan. 26, 2023

(65) Prior Publication Data

US 2024/0213996 A1 Jun. 27, 2024

(30) Foreign Application Priority Data

Dec. 27, 2022 (GR) .............................. 20220101081

(51) Int. Cl.
*H03M 1/12* (2006.01)

(52) U.S. Cl.
CPC .................................. *H03M 1/124* (2013.01)

(58) Field of Classification Search
CPC ..................................................... H03M 1/124
See application file for complete search history.

(56) References Cited

U.S. PATENT DOCUMENTS

2023/0110316 A1* 4/2023 Pardo .................. G06F 9/30036
712/220

\* cited by examiner

*Primary Examiner* — Jean B Jeanglaude
(74) *Attorney, Agent, or Firm* — Lowenstein Sandler LLP

(57) ABSTRACT

Minimum processing performed at a signal device level is enabled, such that the majority of the non-domain-specific processing can be offloaded to a processing device. For example, the processing device can receive signal data from a signal device, preprocess the signal data to obtain preprocessed signal data having a data format for domain-specific processing by software executed by at least one processing unit of a processing platform, and provide the preprocessed signal data for domain-specific processing by the software executed by the at least one processing unit.

20 Claims, 7 Drawing Sheets

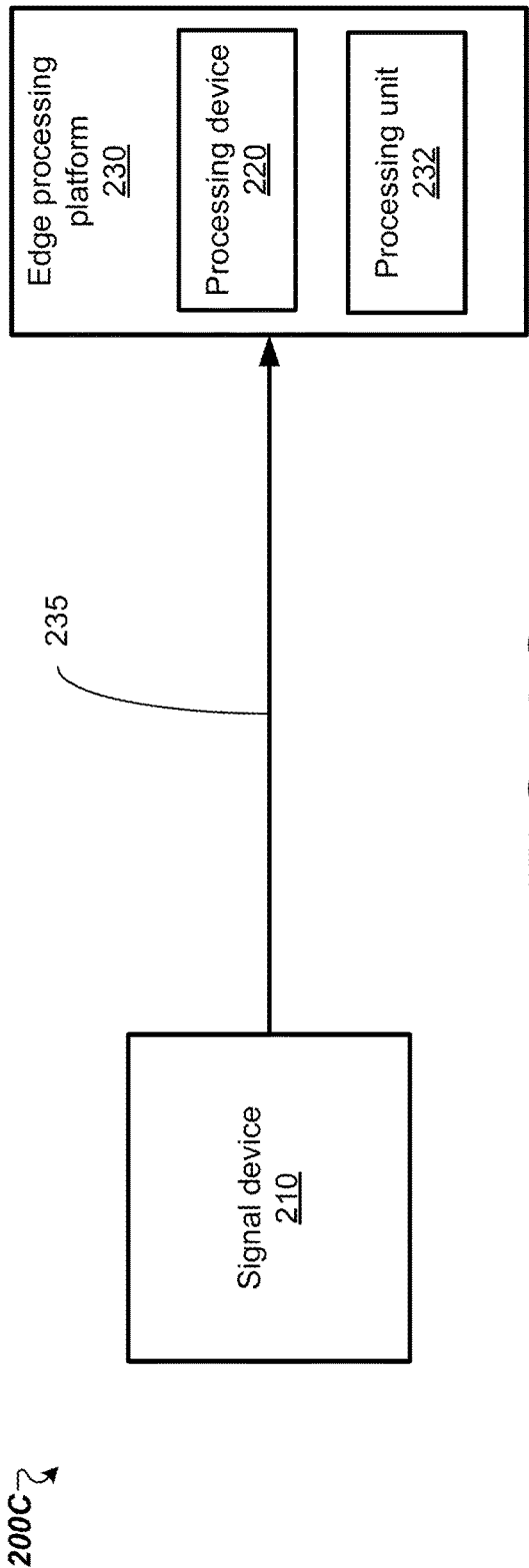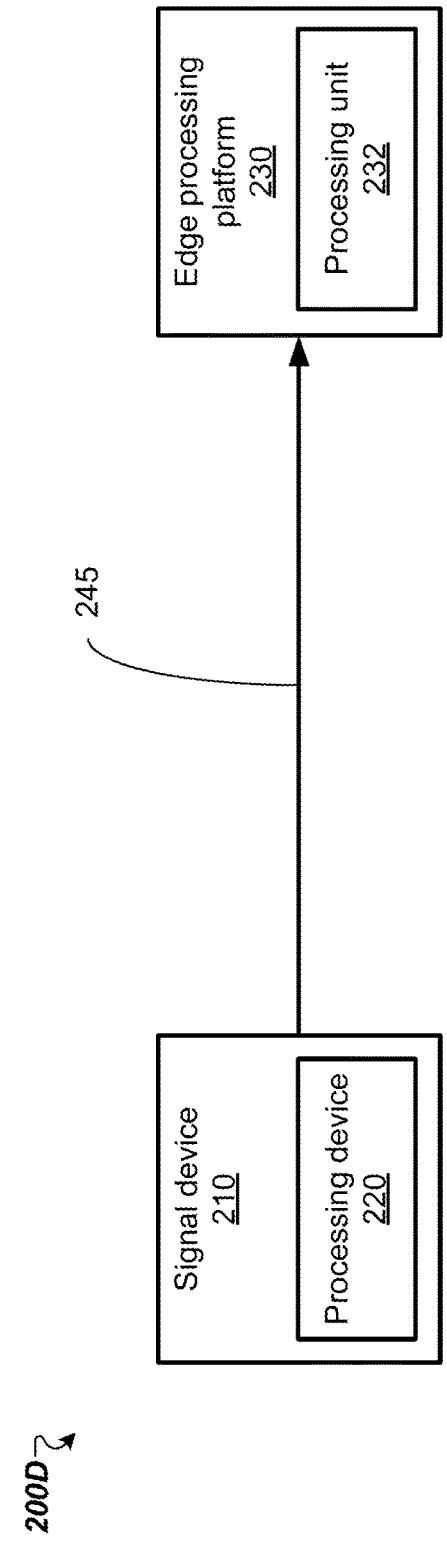

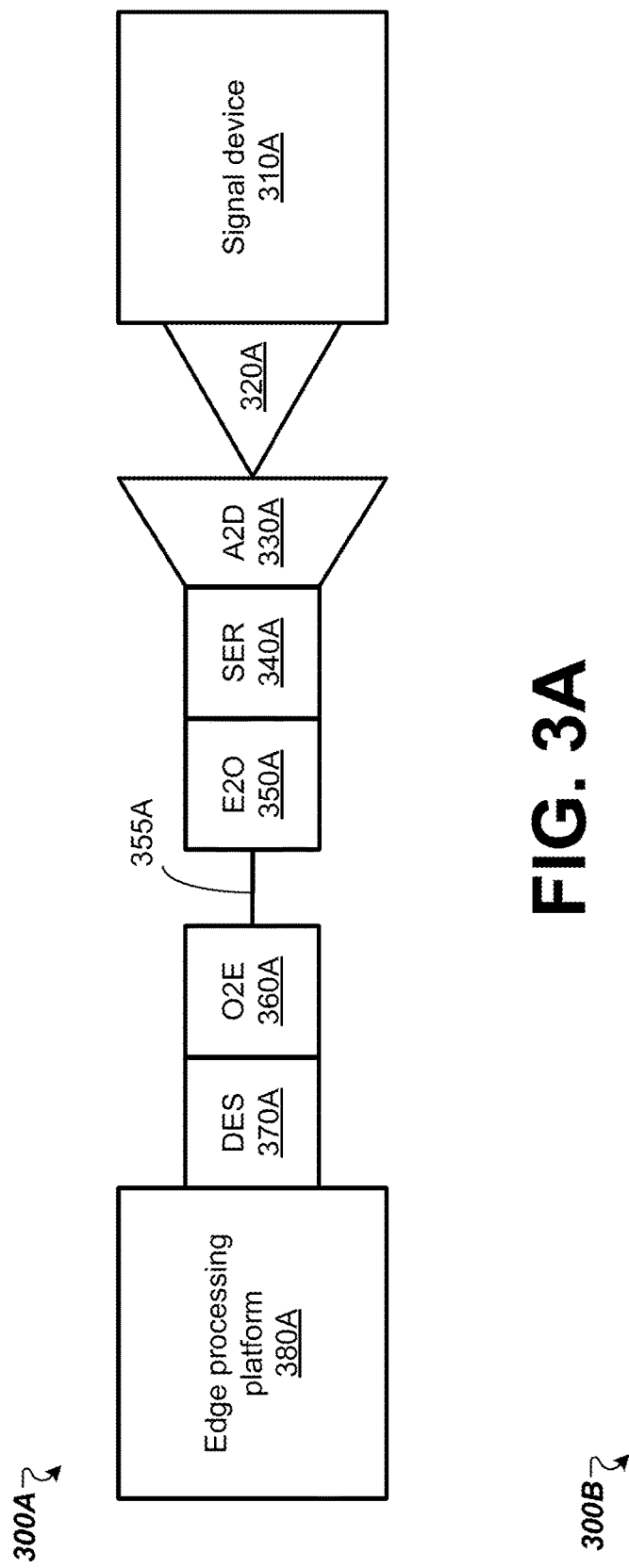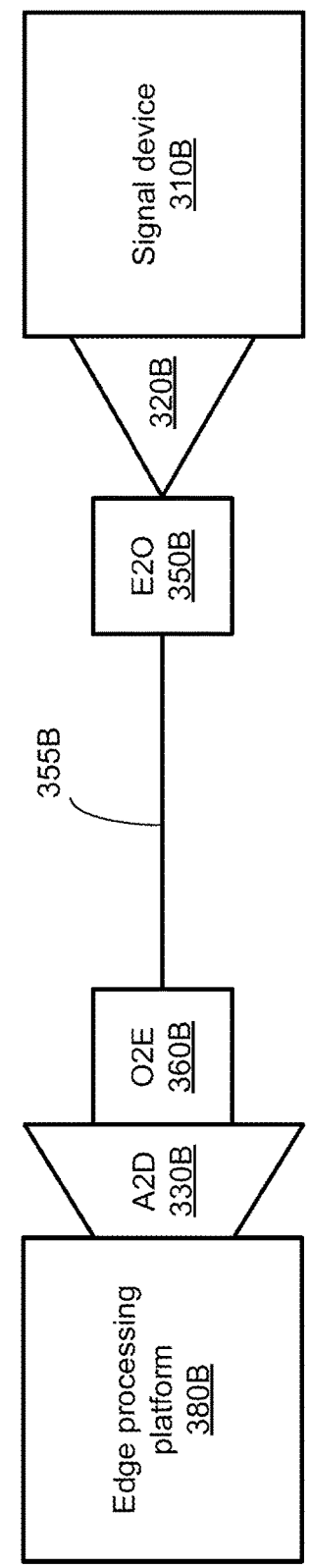
FIG. 3A
FIG. 3B

SOFTWARE-DEFINED SIGNAL DEVICE SYSTEMS

CROSS-REFERENCE TO RELATED APPLICATION(S)

The present application claims priority under 35 U.S.C. § 119(a) to Greek Patent Application No. 20220101081, filed on Dec. 27, 2022 and entitled "SOFTWARE-DEFINED SIGNAL DEVICE SYSTEMS", the contents of which are incorporated by reference herein in their entirety for all purposes.

TECHNICAL FIELD

At least one embodiment pertains to processing resources used to perform high-speed communications. For example, at least one embodiment pertains to technology for software-defined signal device systems that split signal device platforms into respective hardware components and software components.

BACKGROUND

Communications systems transmit and receive signals at a high data rate (e.g., up to 200 gigabits per second (Gbits/sec). High-speed transmissions may exhibit noise attributes (e.g., due to the transmission medium) that require the use of communication devices (e.g., transmitters and receivers) configured to perform digital pre-processing by the transmitter device and post-processing by the receiver device. For example, the transmitter can use serial communication to transmit serial data within a serial data stream to the receiver via a serial communication channel (e.g., data sent sequentially on a per-bit basis over a single channel). As another example, the transmitter can use parallel communication to transmit parallel data within a parallel data stream to the receiver via the communication channel (i.e., multiple bits of data sent simultaneously via respective channels). To convert from the digital to analog domains and from the analog to digital domains, digital-to-analog converters (DAC) and/or analog-to-digital converters (ADC) may be used. The employed DACs and/or ADCs are configured to operate at a particular data rate (i.e., an operation rate) at a particular analog bandwidth (e.g., very high analog bandwidth).

BRIEF DESCRIPTION OF DRAWINGS

Various embodiments in accordance with the present disclosure will be described with reference to the drawings, in which:

FIGS. 2A-2D are block diagrams of example software-defined signal device systems, in accordance with at least some embodiments.

FIG. 3A is a block diagram of an example analog-over-fiber signal processing architecture, in accordance with at least some embodiments.

FIG. 3B is a block diagram of an example digital-over-fiber signal processing architecture, in accordance with at least some embodiments.

DETAILED DESCRIPTION

Figure 1:
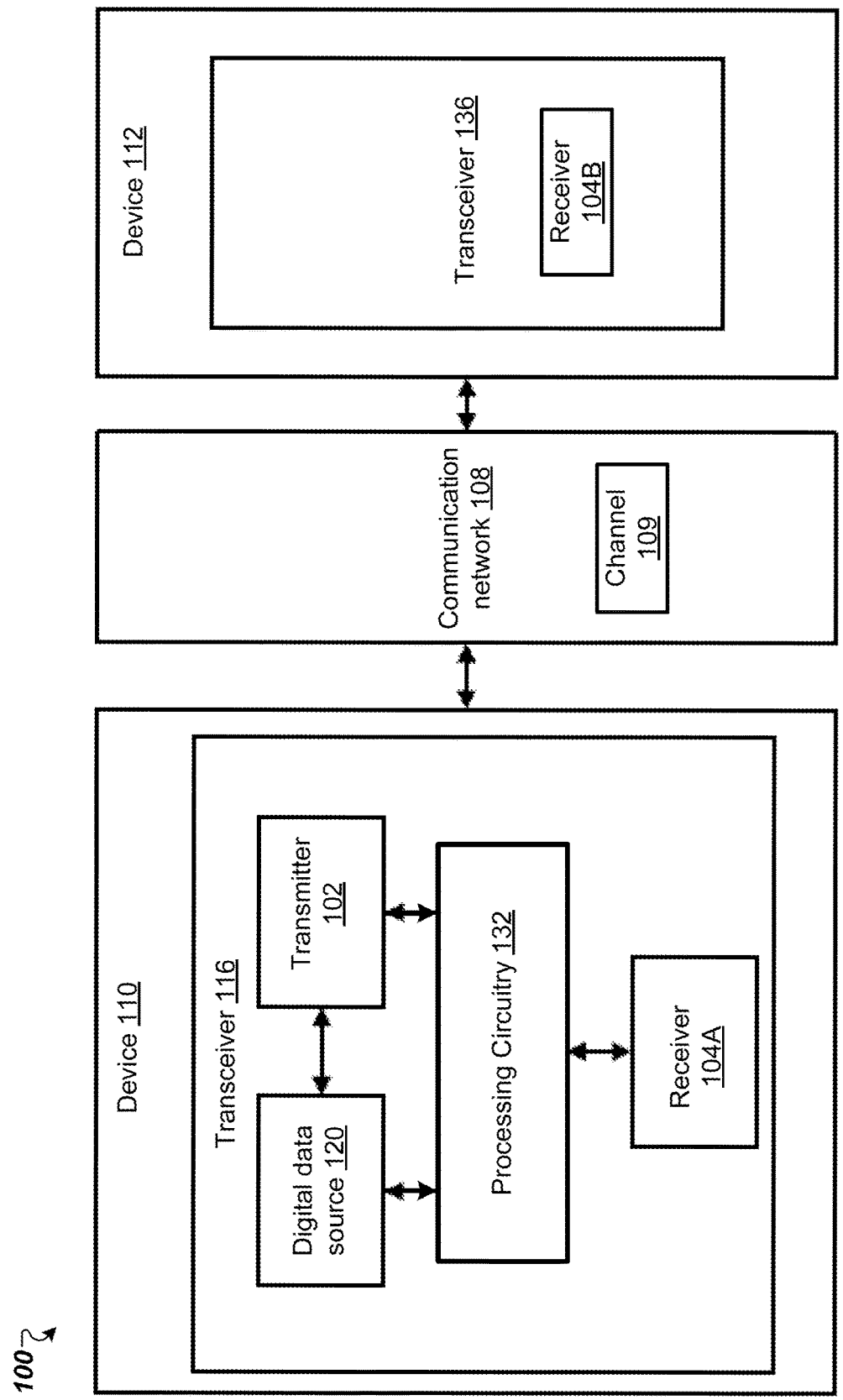
FIG. 1 illustrates an example communication system, in accordance with at least some embodiments.

At least one embodiment pertains to technology for software-defined signal device systems. A signal device can be a signal generator or a signal receiver. In some embodiments, a signal device can include at least one of a physical sensor ("sensor"), an actuator, a receiver, or a transmitter. For example, a receiver can be a wireless receiver, optical receiver or an acoustic receiver, and a transmitter can be a wireless transmitter, an optical transmitter, or an acoustic transmitter. A sensor is a device that generates a signal in response to receiving an input from an environment (i.e., converts the input into a signal). Examples of sensors include temperature sensors, pressure sensors, light sensors, accelerometers, proximity sensors, etc. An actuator is a device that generates motion in response to receiving an input signal and/or energy (i.e., converts the input into a mechanical response). Examples of actuators include linear actuators (e.g., electric linear actuators), rotary actuators (e.g., electric rotary actuators), electromechanical actuators, hydraulic actuators (e.g., electrohydraulic actuators), thermal actuators, magnetic actuators, etc. Signal devices can be embedded in Internet of Things (IoT) devices (e.g., "smart" devices).

Some signal processing implementations rely on low-latency processing in close proximity to a signal device. To achieve this, some signal processing architectures can include a signal device having analog probes coupled with an embedded processing device. For example, the embedded processing device can be a field-programmable gate array (FPGA). An FPGA is an integrated circuit that is configurable post-manufacturing (e.g., by an end-user or customer). A vendor of the signal device can package physical layer processing, business logic, etc. in the embedded processing device to enable the embedded processing device to implement signal processing techniques and output data (e.g., measurement data) in a particular format. For example, the format can be a proprietary vendor format.

With the expansion of signal processing to edge processing platforms, such as in an internet of things (IoT) system, signal processing architectures can limit applicability with respect to, for example, cloud-native applications. Edge processing generally refers to the concept of bringing computation and data storage closer to an IoT device (e.g., signal generator or the signal receiver), instead of to a central remote entity (e.g., datacenter), to improve response time and conserve bandwidth. For example, the management, orchestration and updates for signal generators/receivers can be performed through manual, proprietary methods. Additionally, the more "intelligence" that is coupled inside of a signal generator/receiver, the larger the attack surface. Thus, embedded processing devices may be vulnerable to hacking, which can make it easier for hackers to spoof digitally processed signals as compared to physical layer signals.

Additionally, data of one signal device may have a different format from data of another signal device. Thus, different signal device implementations can have different ways of processing signal data into a suitable format. Accordingly, some signal devices may be proprietary monolithic platforms with embedded processing devices that are inflexible, cannot be natively managed and orchestrated, are constrained by tight power requirements, are prone to attacks, and do not allow for rapid innovation (e.g., in the field of digital signal processing).

Aspects of the present disclosure can address the deficiencies above and other challenges by implementing software-defined signal device systems. Embodiments described herein can reduce (e.g., eliminate) the amount of data processing performed by a signal device using an embedded processing device by offloading most, if not all of, processing to an edge processing platform. The signal device can include at least one of a physical sensor, an actuator, a receiver, or a transmitter. For example, a receiver can be a wireless receiver, optical receiver or an acoustic receiver, and a transmitter can be a wireless transmitter, an optical transmitter, or an acoustic transmitter.

The edge processing platform can include at least one processing unit that executes software for processing signal data received from the signal device. More specifically, the signal device can send signal data to at least one processing device to preprocess the signal data using non-domain-specific processing, and the at least one processing device can provide the preprocessed data for domain-specific processing by the software executed by the at least one processing unit.

Non-domain-specific processing refers to the processing of signal data in order to extract non-domain-specific information from the signal data. Non-domain-specific processing can include processing related to data formatting. For example, preprocessing the signal data using non-domain-specific processing can include assigning, to the signal data, a data identifier corresponding to a location for storing the signal data within the edge processing platform (i.e., a memory location).

Domain-specific processing refers to the processing of signal data in order to extract domain-specific information from the signal data. More particularly, domain-specific processing can involve applying an interpretation model to signal data to obtain the domain-specific information. The interpretation model may require knowledge about the meaning of data, select physical laws relevant to the physical phenomena affecting the captured signal data, the physical properties of the systems involved, and may be given in advance or may be computed (e.g., adjusted) on the fly. One example of domain-specific processing is transforming the relative timing of emitted and received acoustic ultrasound waves into a depth measurement using an ultrasound wave propagation model. Another example of domain-specific processing is beamforming of signal data.

In some embodiments, the at least one processing device is a standalone device (i.e., remote from the edge processing platform and/or the signal device). In some embodiments, the at least one processing device is included within at least one of the edge processing platform or the signal device.

In some embodiments, the at least one processing unit includes at least one central processing unit (CPU). In some embodiments, the at least one processing unit includes at least one graphics processing unit (GPU). In some embodiments, the at least one processing unit includes at least one data processing unit (DPU). A DPU is a programmable processor that can provide a high-performance software-programmable multi-core CPU, a high-performance network interface, and flexible and programmable acceleration engines. For example, a DPU can be a standalone embedded processor. As another example, a DPU can be incorporated into a network interface controller (NIC) to implement a DPU-based NIC. Within the DPU-based NIC, the DPU can implement network traffic processing that would have been performed by the CPU. That is, the DPU can offload processing tasks that would normally be handled by a system CPU. A DPU can be application-specific integrated circuit (ASIC)-based, field FPGA-based, SoC-based, etc.

Communication (e.g., real-time communication) between the signal device and the edge processing platform can be bidirectional with the software executed by the at least one processing unit of the edge processing platform instructing the signal device what to transmit, and the signal device sending signal data it generates and/or receives to the edge processing platform for processing in software. Accordingly, the interpretation of what the signals "mean" is performed in software, as opposed to being done in an embedded processor within the signal device. Further details regarding software-defined signal device systems, including the signal device, the at least one processing device and the edge processing platform including the at least one processing unit will be described below with reference to FIGS. 1A-5.

Embodiments described herein can achieve technological advantages. For example, the domain-specific processing performed by the software executed by the at least one processing unit of the edge processing platform described herein can run in real-time or near real-time with the signal device as the signal device interacts with the real-world due to the synchronization. As another example, the signal processing architecture can increase and/or provide additional compute resources. Thus, the signal processing architecture described herein can promote active research and development with respect to signal processing techniques.

FIG. 1 illustrates an example communication system 100 according to at least one example embodiment. The system 100 includes a device 110, a communication network 108 including a communication channel 109, and a device 112. In at least one example embodiment, devices 110 and 112 correspond to one or more of a Personal Computer (PC), a laptop, a tablet, a smartphone, a server, a collection of servers, or the like. In some embodiments, the devices 110 and 112 may correspond to any appropriate type of device that communicates with other devices also connected to a common type of communication network 108. According to embodiments, the receiver 104A, 104B of devices 110 or 112 may correspond to a graphics processing unit (GPU), a switch (e.g., a high-speed network switch), a network adapter, a central processing unit (CPU), etc. As another specific but non-limiting example, the devices 110 and 112 may correspond to servers offering information resources, services and/or applications to user devices, client devices, or other hosts in the system 100.

Examples of the communication network 108 that may be used to connect the devices 110 and 112 include an Internet Protocol (IP) network, an Ethernet network, an InfiniBand (IB) network, a Fibre Channel network, the Internet, a cellular communication network, a wireless communication network, combinations thereof (e.g., Fibre Channel over Ethernet), variants thereof, and/or the like. In one specific, but non-limiting example, the communication network 108 is a network that enables data transmission between the devices 110 and 112 using data signals (e.g., digital, optical, wireless signals).

The device 110 includes a transceiver 116 for sending and receiving signals, for example, data signals. The data signals may be digital or optical signals modulated with data or other suitable signals for carrying data.

The transceiver 116 may include a digital data source 120, a transmitter 102, a receiver 104A, and processing circuitry 132 that controls the transceiver 116. The digital data source 120 may include suitable hardware and/or software for outputting data in a digital format (e.g., in binary code and/or thermometer code). The digital data output by the digital data source 120 may be retrieved from memory (not illustrated) or generated according to input (e.g., user input).

The transmitter 102 includes suitable software and/or hardware for receiving digital data from the digital data source 120 and outputting data signals according to the digital data for transmission over the communication network 108 to a receiver 104B of device 112. In an embodiment, the transmitter 102 includes a VADC 150. Additional details of the structure of the transmitter 102 and VADC 150 are discussed in more detail below with reference to the figures.

The receiver 104A, 104B of device 110 and device 112 may include suitable hardware and/or software for receiving signals, for example, data signals from the communication network 108. For example, the receivers 104A, 104B may include components for receiving processing signals to extract the data for storing in a memory.

The processing circuitry 132 may comprise software, hardware, or a combination thereof. For example, the processing circuitry 132 may include a memory including executable instructions and a processor (e.g., a microprocessor) that executes the instructions on the memory. The memory may correspond to any suitable type of memory device or collection of memory devices configured to store instructions. Non-limiting examples of suitable memory devices that may be used include Flash memory, Random Access Memory (RAM), Read Only Memory (ROM), variants thereof, combinations thereof, or the like. In some embodiments, the memory and processor may be integrated into a common device (e.g., a microprocessor may include integrated memory). Additionally or alternatively, the processing circuitry 132 may comprise hardware, such as an application specific integrated circuit (ASIC). Other non-limiting examples of the processing circuitry 132 include an Integrated Circuit (IC) chip, a Central Processing Unit (CPU), a General Processing Unit (GPU), a microprocessor, a Field Programmable Gate Array (FPGA), a collection of logic gates or transistors, resistors, capacitors, inductors, diodes, or the like. Some or all of the processing circuitry 132 may be provided on a Printed Circuit Board (PCB) or collection of PCBs. It should be appreciated that any appropriate type of electrical component or collection of electrical components may be suitable for inclusion in the processing circuitry 132. The processing circuitry 132 may send and/or receive signals to and/or from other elements of the transceiver 116 to control the overall operation of the transceiver 116.

The transceiver 116 or selected elements of the transceiver 116 may take the form of a pluggable card or controller for the device 110. For example, the transceiver 116 or selected elements of the transceiver 116 may be implemented on a network interface card (NIC).

The device 112 may include a transceiver 136 for sending and receiving signals, for example, data signals over a channel 109 of the communication network 108. The same or similar structure of the transceiver 116 may be applied to transceiver 136, and thus, the structure of transceiver 136 is not described separately.

Although not explicitly shown, it should be appreciated that devices 110 and 112 and the transceivers 116 and 136 may include other processing devices, storage devices, and/or communication interfaces generally associated with computing tasks, such as sending and receiving data.

Figure 2A:
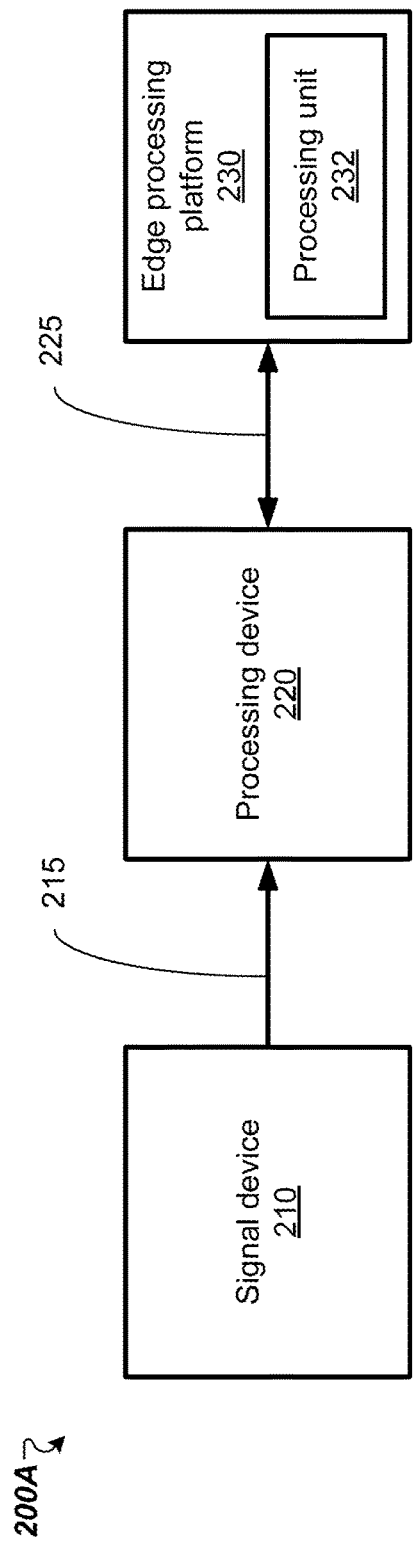

FIG. 2A illustrates an example software-defined signal device system ("system") 200A, in accordance with at least some embodiments. As shown, the system 200A includes a signal device 210. In some embodiments, the signal device 210 can include at least one of a physical sensor, an actuator, a receiver, or a transmitter. For example, a receiver can be a wireless receiver, optical receiver or an acoustic receiver, and a transmitter can be a wireless transmitter, an optical transmitter, or an acoustic transmitter. In this example, the signal device 210 is configured to generate or receive an optical signal. In some embodiments, the signal device 210 can perform some limited signal processing (e.g., Fourier Transform).

The system 200A further includes a processing device 220 coupled to the signal device 210 by a link 215, and an edge processing platform 230, including at least one processing unit 232, coupled to the processing device via a link 225. In some embodiments, the at least one processing unit 232 includes a CPU. In some embodiments, the at least one processing unit 232 includes a GPU. In some embodiments, the at least one processing unit 232 includes a DPU. For example, the at least one processing unit 323 can be used to implement artificial intelligence and/or machine learning with respect to data from the signal generator.

The link 225 can support a low-latency connection between the processing device 220 and the edge processing platform 230. In some embodiments, the link 225 can include relay nodes (e.g., switches and/or routers). The link 215 includes one or more radio frequency (RF) cables. For example, the low-latency connection can include at least one of: an Ethernet connection (e.g., a Time-Sensitive Networking (TSN) Ethernet connection), a fifth-generation broadband cellular network technology (5G) connection (e.g., Ultra-Reliable Low Latency Communications (URLLC)), an IO-Link connection, etc. For example, the low-latency connection can transmit frames at a data transfer rate of 100 gigabits per second (Gbps) (e.g., the low-latency connection can support 100 Gigabit Ethernet (GbE) technology). The low-latency connection may be a connection having a latency below a latency threshold. The latency threshold may be application-specific (i.e., it can depend on the amount of latency needed to implement a particular application).

The processing device 220 is configured to receive signal data from the signal device 210, preprocess the signal data to obtain preprocessed signal data having a data format for processing by software executed by the at least one processing unit 232 of the edge processing platform 230, and send the preprocessed signal data to the edge processing platform 230 over the link 225 for processing by the software executed by the at least one processing unit 232 of the edge processing platform 230.

Figure 2B:
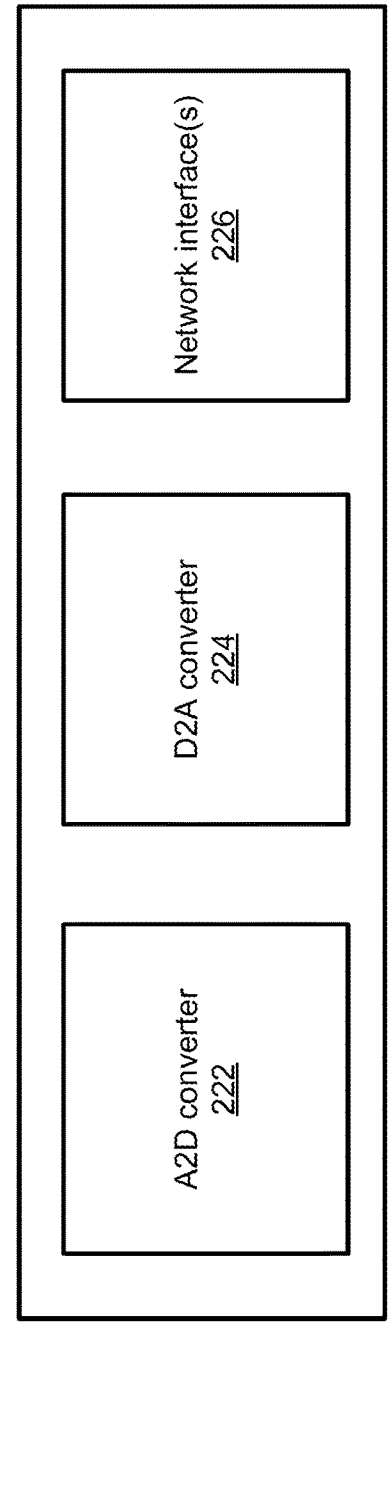

In some embodiments, the signal data received from the signal device 210 includes analog signal data. For example, as shown in FIG. 2B, the processing device 220 can include an analog-to-digital (A2D) converter 222, a digital-to-analog (D2A) converter 224 and at least one network interface 226. For example, the at least one network interface 226 can include a first network interface between the signal device 210 and the processing device 220, and a second network interface between the processing device 220 and the edge processing platform 230. To preprocess the signal data, the processing device 220 can be further configured to convert the analog signal data into digital signal data using the A2D converter 222.

In some embodiments, to preprocess the signal data, the processing device 220 can be further configured to de-serialize the signal data. In some embodiments, to preprocess the signal data, the processing device 220 can be further configured to serialize the signal data. In some embodiments, to preprocess the signal data, the processing device 220 can be further configured to de-packetize the signal data. In some embodiments, to preprocess the signal data, the processing device 220 can be further configured to packetize the signal data.

In some embodiments, to preprocess the signal data, the processing device 220 is further configured to structure the signal data for processing by the software executed by the at least one processing unit 232 of the edge processing platform 230. Illustratively, the processing device 220 can structure the digital signal data by performing at least one of: padding the digital signal data (e.g., extending 9-bit values to 16-bit values), converting the signal data to a different format, or adapting the data format for processing by the software executed by the at least one processing unit 232 of the edge processing platform 230. Examples of converting the signal data to a different format include converting fixed-point to floating point, big-endian to little-endian, etc. Endianess refers to the order or sequence in which bites are transmitted over a communication channel. Big-endian refers to transmitting the most significant bits first, whereas little-endian refers to transmitting the least significant bits first. Additionally or alternatively, structuring the signal data for processing by the edge processing platform can include adapting a data format for the one or more signal processing techniques. For example, if the at least one processing unit 232 includes a GPU, adapting the data format can include selecting a chunk of data that a kernel of the software will process to enable the GPU to perform signal processing using general-purpose parallelized computing. In some embodiments, the kernel of the software platform is a Compute Unified Device Architecture (CUDA®) kernel.

The edge processing platform 230 is configured to receive the signal data from the processing device 220, and the software executed by the at least one processing unit 232 is configured to process the signal data using one or more signal processing techniques. The edge processing platform 230 can process the signal data to be in a particular format for storage (e.g., cloud storage), and can reduce the amount of information transmitted to storage. For example, the software executed by the at least one processing unit 232 of the edge processing platform 230 can perform digital signal processing, and can send data to and/or receive data from the signal device 210 in a packetized and/or depacketized format via the low-latency connection.

In some embodiments, the edge processing platform 230 can be further configured to generate data for transmission to the signal device 210. For example, the data generated by the edge processing platform 230 can include digital data. The processing device 220 can be further configured to receive the data from the edge processing platform 230, convert the data into signal data, and send the signal data to the signal device 210. In some embodiments, the signal device 210 includes at least one of an actuator or an antenna, and the edge processing platform 230 generate instructions to the signal device 210 to cause the signal device 210 to perform an action.

In some embodiments, the edge processing platform 230 can handle data for multiple different types of signal devices. For example, the edge processing platform 230 can receive data from multiple types of signal devices and/or generate data to be sent to multiple types of signal devices. Accordingly, the edge processing platform 230 can be configured to handle data in a variety of different data formats for respective types of signal devices.

In the illustrative example shown in FIG. 2A, the processing device 220 is a standalone device. That is, the processing device 220 is remote from the edge processing platform 230 and the signal device 210. The edge processing platform 230 can be synchronized with the processing device 220. The processing device 220 and the edge processing platform 230 can be synchronized using any suitable synchronization protocol, and thus processing performed by the edge processing platform 230 can run in real-time or near real-time with the signal device 210 as the signal/device 210 interacts with the real-world. For example, the edge processing platform 230 can be synchronized with the processing device 220 using at least one of: Precision Time Protocol (PTP) (IEEE 1588), Synchronous Ethernet (SyncE) (ITU-T 8262.1), etc.

In some embodiments, the processing device 220 is included within at least one of the signal device 210 or the edge processing platform. For example, FIG. 2C illustrates an example system 200C in which the processing device 220 is included within the edge processing platform 230, in accordance with at least some embodiments. The signal device 210 is coupled to the edge processing platform 230 by a link 235. The processing device 220 may be included within the edge processing platform 230 in the case of analog fiber, where the link 235 includes a fiber that transports analog signals in the form of light.

As another example, FIG. 2D illustrates an example system 200D in which the processing device 220 is included within the signal device 210, in accordance with at least some embodiments. The signal device 210 including the processing device 220 is coupled to the edge processing platform 230 by a link 245.

The communication latency and its variability can factor into the design of the overall system. The requirements for communication and processing latencies can be derived from multiple factors. One factor is real-time decision making. For example, if the system 200 is included in a machine decision-making process, decision-making latency can dictate communication latency. Illustratively, assume that the signal device 210 includes a sensor that is coupled to a fast-moving production line. If the sensor is used to decide whether to remove a defective part from the production line, this decision may need to be made in a sub-millisecond span.

Another factor is human interaction. For example, for a visualization to not appear "laggy" to the human eye, the process performed by the system 200 to display a visualization (e.g., the signal device 210 obtains signal data, the processing device 220 preprocesses the signal data and the edge processing platform 230 processes the preprocessed signal and causes the visualization to be displayed) may need to fit within a double-digit millisecond span.

Another factor is buffering. For example, the components of the system 200 do not have infinite buffering. Illustratively, assume that the edge processing platform 230 generates data that instructs the signal device 210 (e.g., actuator/antenna) to perform an action, sends the data to the processing device 220, and the processing device 220 converts the data into signal data. If the signal data has a certain data rate D and the amount of buffering available in the processing device 220 is M, the longest advance with which the edge processing platform 230 can send signal data (the earliest that the data can be sent respective to when it will be consumed by the signal device 210) can be determined by a theoretical upper bound of $T=M/D$.

The network latency values can vary for different use cases. For example, a 5G deployment in which the signal device 210 includes a 5G antenna may require that the network latency to be within a range between 50 microseconds to about 150 microseconds.

As an illustrative example of the system 200A, assume that the system 200A is software-defined ultrasound device system in which the signal device 210 includes an ultrasound device configured to emit an ultrasonic (i.e., high frequency) acoustic wave. For example, the ultrasound device can be a handheld ultrasound probe that can be positioned in proximity to a target object. The system 200A can be used to perform ultrasound imaging. For example, if the target object is the human body, then the signal device 210 can be configured to transmit an acoustic wave into the human body, and receive one or more return signals corresponding to one or more respective reflections of the acoustic wave off of one or more respective tissue boundaries. Each return signal can correspond to an echo. As the acoustic wave propagates further into the human body, it gets partially absorbed and thus the echoes of deeper tissues/organs get progressively weaker.

The depth at which the one or more tissue boundaries are located can be measured by determining an amount of time that passes between transmitting the acoustic wave and receiving the one or more return signals. Simplistically, if the speed of acoustic wave propagation inside the human body is V, the acoustic wave was emitted at time $T_0$ and a return signal corresponding to an echo has been received at time $T_E$, then the depth D at which a reflection was generated (i.e., the distance from the signal device 210 to the respective boundary of the tissue) can be determined as $D=V(T_E-T_0)$. At the same time, the strength of the return signal will at least partially depend on how well-defined ("sharp") the corresponding tissue surface is. Certain parts of a reconstructed image generated from the one or more return signals can be brighter or darker depending on the strength of each return signal. For example, the stronger the return signal, the brighter the corresponding part of the reconstructed image (and vice versa). The frequency of the acoustic wave emitted into the human body can affect the depth of penetration and the precision/resolution of the reconstructed image.

In certain implementations, the ultrasound device is configured to analyze the return signals. More specifically, an analog front-end of the ultrasound device can emit the acoustic wave and receive the return signal(s), and a processing device (e.g., FPGA) embedded within the ultrasound device can convert the return signal(s) into measurements of depth and intensity. Additionally, the processing device embedded within the ultrasound device can further reconstruct complete images. The processing device embedded within the ultrasound device can then communicate those measurements and/or reconstructed image(s) to a visualization station for display on a screen of the visualization station. Accordingly, most, if not all of, the digital signal processing can be performed by a processing device embedded within the ultrasound device in some embodiments.

Instead of processing the ultrasound signal data within the signal device 210, the ultrasound signal data can be processed by software executed by the at least one processing unit 232 of the edge processing platform 230. The edge processing platform 230 can include the visualization station described above. The interface between the edge processing platform 230 and the signal device 210 is effectively a time series of ultrasound signals to be sent by the signal device 210 (in the direction from the edge processing platform 230 to the signal device 210) and a time series of the data received by the signal device 210 (in the direction from the signal device 210 to the edge processing platform 230).

Ultrasound imaging performed by the system 200A can be improved in a variety of ways. For example, instead of using a single frequency, multiple frequencies can be multiplexed. As another example, transmit beamforming can be performed by coordinating the transmission from multiple antennae emitting the audio wave (e.g., speakers) to cause the "small" waves to positively interfere at a particular location inside the body while cancelling out elsewhere. Transmit beamforming effective creates an acoustic "beam" that is focused at a particular region of the body. As yet another example, receive beamforming can be performed by using multiple receivers (e.g., microphones) to obtain an improved return signal. For example, the signal device 210 can be operatively coupled to (e.g., include) a front-end including multiple antennae and/or multiple receivers. If the system 200A implements transmit beamforming and/or receive beamforming, each entry in the time series can include multiple values. For example, each value can correspond to a respective antenna (e.g., speaker) and/or each value can correspond to a respective receiver (e.g., microphone).

The estimation of the depth of the tissue boundaries can be calculated based on when the signal device 210 was instructed, by the software executed by the at least one processing unit 232 of the edge processing platform 230, to send out the acoustic wave and timestamps for when the signal device 210 received the data. As the acoustic wave transmitted from the signal device 210 can be entirely decided by the software executed by the at least one processing unit 232 of the edge processing platform 230, complex schemes for generating acoustic waves and interpreting their results are possible.

Thus, instead of processing ultrasound signal data within a processing device embedded within the signal device 210, the ultrasound signal data can be processed by software executed by the at least one processing unit 232 of the edge processing platform 230. The communication between the edge processing platform 230 and the signal device 210 can be bidirectional, with the software executed by the at least one processing unit 232 of the edge processing platform 230 instructing the ultrasound device of the signal device 210 what to transmit and the ultrasound device of the signal device 210 sending ultrasound signals that it received to the edge processing platform 230 for processing by the software executed by the at least one processing unit 232.

As another illustrative example of the system 200A, assume that the system 200A is software-defined smart factory system. Smart factory deployments typically feature large numbers of sensors that monitor and control manufacturing and logistics equipment. Typically, data generated by sensors within the smart factory (e.g., temperature sensor, gas analyzers) can be fed provided to a central control system via digital buses supporting a data communication protocol (e.g., Modbus data communication protocol). Each sensor of the smart factory can perform on-chip A2D conversion and send digital data over a link. However, this type of smart factory sensor implementation can be expensive, and the additional circuitry can increase the number of failure points. By employing the protected functional split of sensors where the sensor end-devices can implement the analog part and the digital signal/baseband processing can occur on a centralized entity over the network, the sensor end-devices can become cheaper, simpler and smaller which can improve smart factory deployment solutions.

In some embodiments, the signal device 210 can send data directly to the edge processing platform 230. This can eliminate the need for an intermediary processing device 220 described above. For example, the system 200 can include a "digital-over-fiber" architecture in which signal data from the signal device 210 can be transmitted to the edge processing platform 230 by sending digitized signal data using packets (i.e., in packetized form) over a communication link. As another example, the system 200 can include an "analog-over-fiber" architecture in which analog signal data is transmitted from the signal device 210 over a communication link and translated into another domain. Illustratively, an analog-over-fiber architecture can convert the analog signal data into light by modulating one or more optical properties of the light (e.g., intensity, phase, polarization) with the analog signal. An example of a digital-over-fiber architecture will now be described below with reference to FIG. 3A, and an example of an analog-over-fiber architecture will be described below with reference to FIG. 3B.

FIG. 3A illustrates an example digital-over-fiber architecture ("architecture") 300A, in accordance with at least some embodiments. The architecture 300A can be a packet-based network architecture. More specifically, the architecture 300B can transmit digitized signals using packets (i.e., in a packetized form) over a commodity network connection (e.g., Ethernet).

For example, as shown, the architecture 300A can include a signal device 310A. The signal device 310A can be similar to the signal device 210 described above with reference to FIG. 2A. In this illustrative example, the signal device 310A is configured to generate optical data. However, such an example should not be considered limiting.

The architecture 300A can further include an amplifier 320A coupled to the signal device 310A. The amplifier 320A is configured to receive an input/output signal from the signal device 310A, and amplify the input/output signal to obtain an amplified signal by increasing its power (e.g., amplitude). The amount of amplification can be measured by the gain, which is the ratio of the output power/current/voltage to the input power/current/voltage. For example, the gain generated by the amplifier 320A can be greater than one.

The architecture 300A can further include an analog-to-digital converter (A2D) 330A coupled to the amplifier 320A. The A2D 330A is configured to receive the amplified signal output by the amplifier 320A, and convert the amplified signal 320A into a digital signal.

The architecture 300A can further include a serializer (SER) 340A coupled to the A2D 330A. The SER 340A is configured to receive the digital signal output by the A2D 330A, and serialize the digital signal to obtain a serial signal. In some embodiments, the serialization includes packetization.

The architecture 300A can further include an electrical-to-optical converter (E2O) 350A coupled to an optical-to-electric converter (O2E) 360A via a line 355A. The E2O 350A is configured to receive the serial signal output by the SER 340A, and convert the serial signal into an optical signal for transmission to the O2E 360A via line 355A. The O2E 360A is configured to receive the optical signal output by the E2O 350A, and convert the optical signal back into the serial signal. If the line 355A is an electrical line instead of an optical line, the architecture may not have and/or utilize the E2O 350A and the O2E 360A.

The architecture 300A can further include a deserializer (DES) 370A coupled to the O2E 360A, and an edge processing platform 380 coupled to the DES 370A. The DES 370A is configured to receive the serial signal output by the O2E 360A, and deserialize the serial signal to obtain the digital signal. The edge processing platform 380A is configured to receive the digital signal output by the DES 370A, and process the digital signal using one or more digital signal processing techniques.

FIG. 3B illustrates an example analog-over-fiber network architecture ("architecture") 300B, in accordance with at least some embodiments. The architecture 300B can translate analog signal data into another domain. For example, the architecture 300B can convert the analog signal data into light by modulating one or more optical properties of the light (e.g., intensity, phase, polarization) with the analog signal.

For example, as shown, the architecture 300B can include a signal device 310B, an amplifier 320B coupled to the signal device 310B, an E2O 350B coupled to the amplifier 320B, an O2E 360B coupled to the E2O 350B, and A2D 330B coupled to the O2E 360B, and an edge processing platform 380B coupled to the A2D 330B. The components 310B, 320B, 330B, 350B, 360B and 380B are similar to the components 310A, 320A, 330A, 350A, 360A and 380A of FIG. 3A. Instead of being a packet-based architecture such as the architecture 300A of FIG. 3A, is not packet-based. More specifically, the connection between the signal device 310B and the edge processing platform 380B is an analog connection (e.g., an analog fiber). In the architecture 300B, analog signals can be fed directly into the physical cabling of the network, and the analog signals can be recovered using the A2D 330B coupled to the edge processing platform 380B.

Figure 4A:
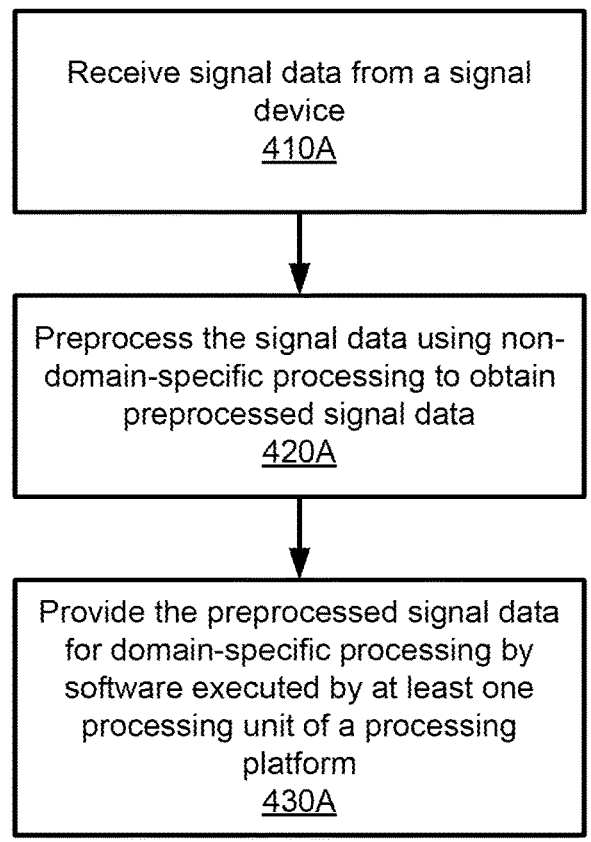
FIGS. 4A-4C are flow diagrams of example methods of implementing software-defined signal device systems, in accordance with at least some embodiments.

FIG. 4A is a flow diagram of an example method 400A of implementing software-defined signal device systems, in accordance with at least some embodiments. The method 400A can be performed by processing logic comprising hardware, software, firmware, or any combination thereof. In at least one embodiment, the method 400A is performed by a processing device, such as the processing device 220 and/or the edge processing platform 230 of FIGS. 2A-2B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410A, a processing device receives signal data from a signal device. More specifically, the processing device and the signal device are included in a software-defined signal device system. In some embodiments, a signal device can include at least one of a physical sensor, an actuator, a receiver, or a transmitter. For example, a receiver can be a wireless receiver, optical receiver or an acoustic receiver, and a transmitter can be a wireless transmitter, an optical transmitter, or an acoustic transmitter. In some embodiments, the system includes a digital-over-fiber architecture (e.g., the architecture 300A of FIG. 3A). In some embodiments, the system includes an analog-over-fiber architecture (e.g., the architecture 300B of FIG. 3B).

At operation 420A, the processing device preprocesses the signal data using non-domain specific processing to obtain preprocessed signal data. At operation 430A, the processing device provide the preprocessed signal data for domain-specific processing by software executed by at least one processing unit of a processing platform. More specifically, the processing platform is included in the software-defined signal device system. In some embodiments, the processing platform is an edge processing platform. Nondomain-specific processing refers to processing that does not require knowledge about the meaning of data (e.g., data formatting). Domain-specific processing refers to processing that requires knowledge about the meaning of data. One example of domain-specific processing is beamforming of signal data.

The preprocessed signal data can have a data format for domain-specific processing by the software executed by the at least one processing unit of the processing platform. For example, the data format can be an optimal data format for domain-specific processing (e.g., digital signal processing) by the software executed by the at least one processing unit of the processing platform. In some embodiments, the at least one processing unit includes a CPU. In some embodiments, the at least one processing unit includes a GPU. In some embodiments, the at least one processing unit includes a DPU. For example, the at least one processing unit can be used to implement artificial intelligence and/or machine learning with respect to data from the signal generator.

Preprocessing the signal data at operation 420A can include assigning, to the signal data, a data identifier corresponding to a location for storing the signal data within the processing platform (i.e., a memory location). For example, the processing device can assign a timestamp to signal data, which can be used to temporally allocate the storage location of the signal data within the memory of the processing platform.

In some embodiments, preprocessing the signal data at operation 420A can further include performing at least one of: converting analog signal data into digital signal data using an A2D converter or structuring the signal data for processing by the processing platform. More specifically, the signal data can be aligned with a suitable data format for domain-specific processing by the at least one processing unit of the processing platform.

Illustratively, structuring the signal data into the data format can include performing at least one of: padding the signal data to include a suitable number of bits (e.g., extending 9-bit values to 16-bit values), converting the signal data to a different format, etc. Examples of converting the signal data to a different format include converting fixed-point to floating point, big-endian to little-endian, etc. Additionally or alternatively, structuring the signal data for processing into the data format can include adapting a data format for the one or more signal processing techniques. For example, if the at least one processing unit of the processing platform includes a GPU, adapting the data format can include selecting a chunk of data that a kernel of a software platform will process to enable the GPU to perform the signal processing technique(s) using general-purpose parallelized computing. In some embodiments, the kernel of the software platform is a CUDA® kernel.

In some embodiments, preprocessing the signal data includes de-serializing the signal data. In some embodiments, preprocessing the signal data includes serializing the signal data. In some embodiments, preprocessing the signal data includes de-packetizing the signal data. In some embodiments, preprocessing the signal data includes packetizing the signal data. Accordingly, preprocessing the signal data can include performing at least one of: de-serializing the signal data, serializing the signal data, packetizing the signal data, or de-packetizing the signal data.

In some embodiments, the processing device is a stand-alone device (i.e., remote from the processing platform and the signal device). In some embodiments, the processing device is included in (e.g., embedded within) at least one of the processing platform or the signal device. The processing platform can be synchronized with the processing device. In some embodiments, the processing platform is synchronized with the processing device using at least one of: PTP or SyncE. The preprocessed signal data can be sent to the processing platform over a low-latency network connection for processing by the software executed by the at least one processing unit of the processing platform. In some embodiments, the low-latency network connection includes at least one of: a TSN Ethernet connection, a 5G URLLC connection, or an IO-Link connection. In some embodiments, the signal device can send data directly to the processing platform (e.g., using a digital-over-fiber architecture or an analog-over-fiber architecture, as described above with reference to FIGS. 3A-3B). Further details regarding operations 410A-430A are described above with reference to FIGS. 2-3B.

Figure 4B:
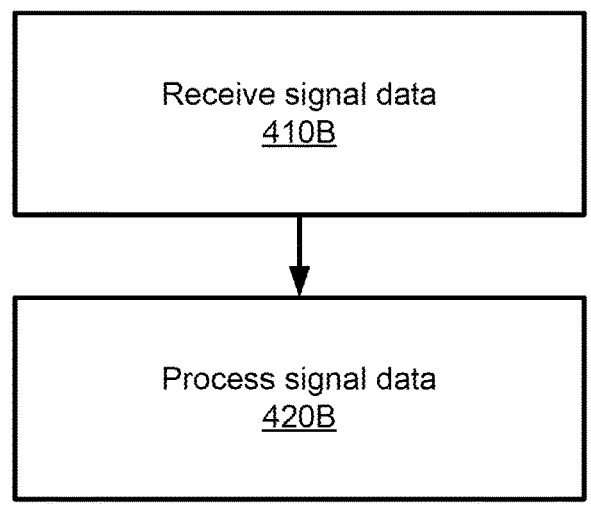

FIG. 4B is a flow diagram of an example method 400B of implementing software-defined signal device systems, in accordance with at least some embodiments. The method 400B can be performed by processing logic comprising hardware, software, firmware, or any combination thereof. In at least one embodiment, the method 400B is performed by a processing platform, such as the edge processing platform 230 of FIG. 2A. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410B, a processing device receives signal data. For example, the signal data can be preprocessed signal data obtained by the preprocessing performed during operation 420A of FIG. 4A. As another example, the signal data can be received directly from a signal device (e.g., sensor or actuator).

At operation 420B, the processing device processes the signal data. For example, if the signal data includes preprocessed signal data, the preprocessed signal data can be processed using one or more signal processing techniques. As another example, if the signal data includes raw signal data, processing the signal data can include preprocessing the signal data to obtain preprocessed signal data (e.g., similar to operation 420A of FIG. 4A), and processing the preprocessed signal data using the one or more signal processing techniques. Further details regarding operations 410B and 420B are described above with reference to FIGS. 2-4A.

Figure 4C:
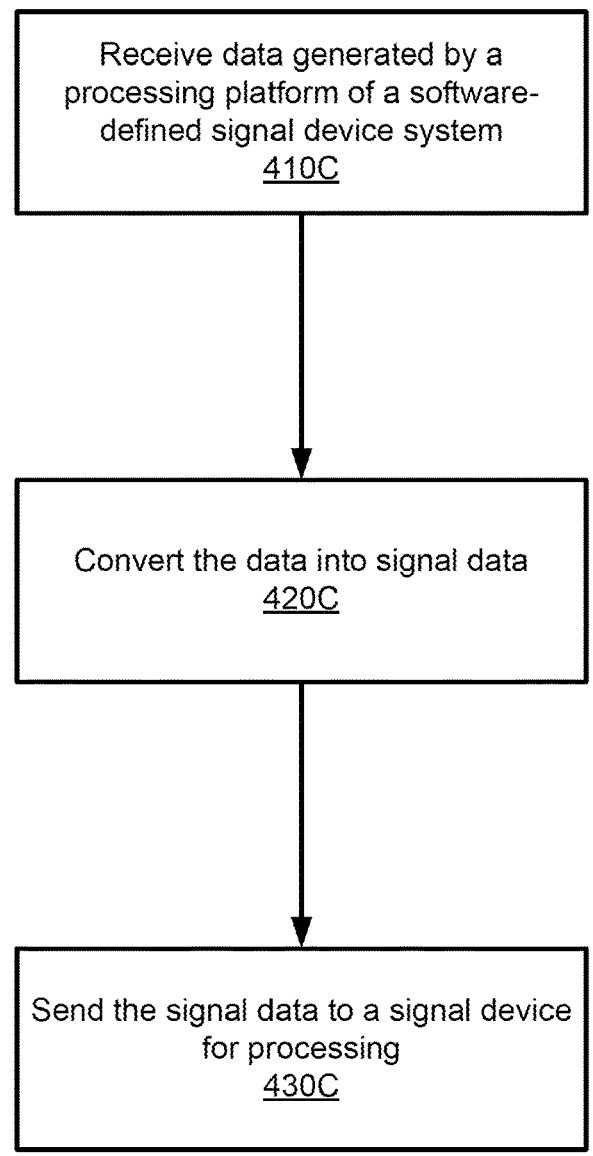

FIG. 4C is a flow diagram of an example method 400C of implementing software-defined signal device systems, in accordance with at least some embodiments. The method 400C can be performed by processing logic comprising hardware, software, firmware, or any combination thereof. In at least one embodiment, the method 400C is performed by a processing device, such as the processing device 220 and/or the edge processing platform 230 of FIGS. 2A-2B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410C, a processing device receives data from a processing platform of a software-defined signal device system. In some embodiments, the data is generated by software executed by at least one processing unit of the processing platform. For example, the data can include digital data. In some embodiments, the software-defined signal device system includes a digital-over-fiber architecture (e.g., the architecture 300A of FIG. 3A). In some embodiments, the software-defined signal device system includes an analog-over-fiber architecture (e.g., the architecture 300B of FIG. 3B). In some embodiments, the processing device is included within at least one of the processing platform or the signal device. In some embodiments, the processing platform is remote from the processing device and can be synchronized with the processing device. In some embodiments, the processing platform is an edge processing platform.

At operation 420C, the processing device converts the data into signal data. For example, assume that the data received from the processing platform has 16-bit values, but the D2A converter can only handle 9-bit values. Thus, the processing device can convert the 16-bit value data into 9-bit value data.

At operation 430C, the processing device sends the signal data to a signal device for processing. In some embodiments, a signal device can include at least one of a physical sensor, an actuator, a receiver, or a transmitter. For example, a receiver can be a wireless receiver, optical receiver or an acoustic receiver, and a transmitter can be a wireless transmitter, an optical transmitter, or an acoustic transmitter. The signal data has a format suitable for use by the signal device. In some embodiments, the signal device includes a sensor. In some embodiments, the signal device includes an actuator. Further details regarding operations 410C-430C are described above with reference to FIGS. 2-3.

Figure 5:
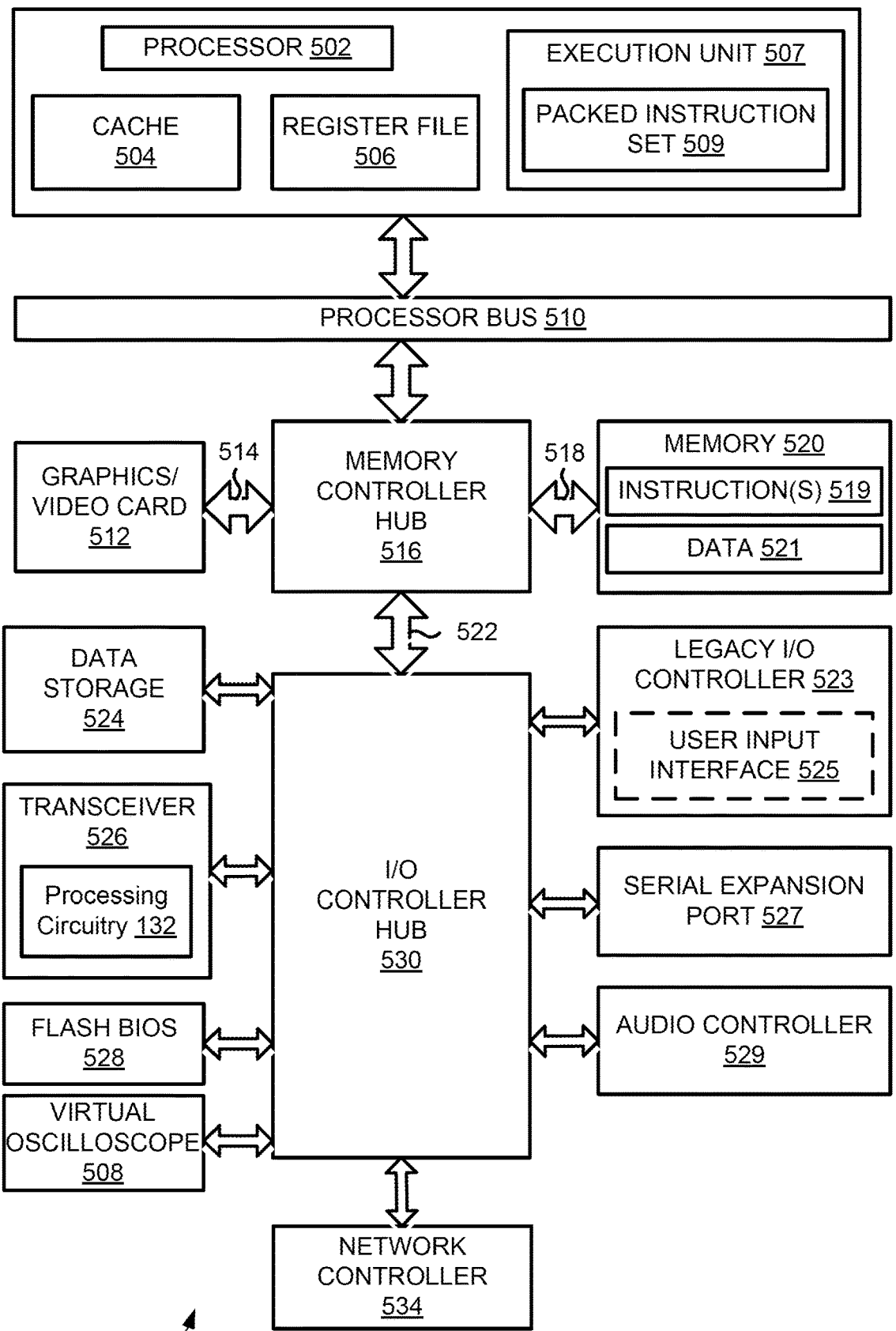
FIG. 5 illustrates an example computer system, in accordance with at least some embodiments.

FIG. 5 illustrates a computer system 500, in accordance with at least one embodiment. In at least one embodiment, computer system 500 may be a system with interconnected devices and components, an SOC, or some combination. In at least one embodiment, computer system 500 is formed with a processor 502 that may include execution units to execute an instruction. In at least one embodiment, computer system 500 may include, without limitation, a component, such as processor 502, to employ execution units including logic to perform algorithms for processing data. In at least one embodiment, computer system 500 may include processors, such as PENTIUM® Processor family, Xeon™, Itanium®, XScale™ and/or StrongARM™, Intel® Core™, or Intel® Nervana™ microprocessors available from Intel Corporation of Santa Clara, California, although other systems (including PCs having other microprocessors, engineering workstations, set-top boxes and like) may also be used. In at least one embodiment, computer system 500 may execute a version of WINDOWS' operating system available from Microsoft Corporation of Redmond, Wash., although other operating systems (UNIX and Linux for example), embedded software, and/or graphical user interfaces may also be used.

In at least one embodiment, computer system 500 may be used in other devices such as handheld devices and embedded applications. Some examples of handheld devices include cellular phones, Internet Protocol devices, digital cameras, personal digital assistants ("PDAs"), and handheld PCs. In at least one embodiment, embedded applications may include a microcontroller, a digital signal processor (DSP), an SoC, network computers ("NetPCs"), set-top boxes, network hubs, wide area network ("WAN") switches, or any other system that may perform one or more instructions. In an embodiment, computer system 500 may be used in devices such as graphics processing units (GPUs), network adapters, central processing units and network devices such as switch (e.g., a high-speed direct GPU-to-GPU interconnect such as the NVIDIA GH100 NVLINK or the NVIDIA Quantum 2 64 Ports InfiniBand NDR Switch).

In at least one embodiment, computer system 500 may include, without limitation, processor 502 that may include, without limitation, one or more execution units 507 that may be configured to execute a Compute Unified Device Architecture ("CUDA") program (CUDA® is developed by NVIDIA Corporation of Santa Clara, CA). In at least one embodiment, a CUDA program is at least a portion of a software application written in a CUDA programming language. In at least one embodiment, computer system 500 is a single processor desktop or server system. In at least one embodiment, computer system 500 may be a multiprocessor system. In at least one embodiment, processor 502 may include, without limitation, a CISC microprocessor, a RISC microprocessor, a VLIW microprocessor, a processor implementing a combination of instruction sets, or any other processor device, such as a digital signal processor, for example. In at least one embodiment, processor 502 may be coupled to a processor bus 510 that may transmit data signals between processor 502 and other components in computer system 500.

In at least one embodiment, processor 502 may include, without limitation, a Level 1 ("L1") internal cache memory ("cache") 504. In at least one embodiment, processor 502 may have a single internal cache or multiple levels of internal cache. In at least one embodiment, cache memory may reside external to processor 502. In at least one embodiment, processor 502 may also include a combination of both internal and external caches. In at least one embodiment, a register file 506 may store different types of data in various registers including, without limitation, integer registers, floating point registers, status registers, and instruction pointer register.

In at least one embodiment, execution unit 507, including, without limitation, logic to perform integer and floating point operations, also resides in processor 502. Processor 502 may also include a microcode ("ucode") read only memory ("ROM") that stores microcode for certain macro instructions. In at least one embodiment, execution unit 507 may include logic to handle a packed instruction set 509. In at least one embodiment, by including packed instruction set 509 in an instruction set of a general-purpose processor 502, along with associated circuitry to execute instructions, operations used by many multimedia applications may be performed using packed data in a general-purpose processor 502. In at least one embodiment, many multimedia applications may be accelerated and executed more efficiently by using full width of a processor's data bus for performing operations on packed data, which may eliminate a need to transfer smaller units of data across a processor's data bus to perform one or more operations one data element at a time.

In at least one embodiment, an execution unit may also be used in microcontrollers, embedded processors, graphics devices, DSPs, and other types of logic circuits. In at least one embodiment, computer system 500 may include, without limitation, a memory 520. In at least one embodiment, memory 520 may be implemented as a DRAM device, an SRAM device, flash memory device, or other memory devices. Memory 520 may store instruction(s) 519 and/or data 521 represented by data signals that may be executed by processor 502.

In at least one embodiment, a system logic chip may be coupled to processor bus 510 and memory 520. In at least one embodiment, the system logic chip may include, without limitation, a memory controller hub ("MCH") 516, and processor 502 may communicate with MCH 516 via processor bus 510. In at least one embodiment, MCH 516 may provide a high bandwidth memory path 518 to memory 520 for instruction and data storage and for storage of graphics commands, data and textures. In at least one embodiment, MCH 516 may direct data signals between processor 502, memory 520, and other components in computer system 500 and to bridge data signals between processor bus 510, memory 520, and a system I/O 522. In at least one embodiment, a system logic chip may provide a graphics port for coupling to a graphics controller. In at least one embodiment, MCH 516 may be coupled to memory 520 through high bandwidth memory path 518, and graphics/video card 512 may be coupled to MCH 516 through an Accelerated Graphics Port ("AGP") interconnect 514.

In at least one embodiment, computer system 500 may use system I/O 522 that is a proprietary hub interface bus to couple MCH 516 to I/O controller hub ("ICH") 530. In at least one embodiment, ICH 530 may provide direct connections to some I/O devices via a local I/O bus. In at least one embodiment, a local I/O bus may include, without limitation, a high-speed I/O bus for connecting peripherals to memory 520, a chipset, and processor 502. Examples may include, without limitation, an audio controller 529, a firmware hub ("flash BIOS") 528, a wireless transceiver 526, a data storage 524, a legacy I/O controller 523 containing a user input interface 525 and a keyboard interface, a serial expansion port 527, such as a USB, and a network controller 534. Data storage 524 may comprise a hard disk drive, a floppy disk drive, a CD-ROM device, a flash memory device, or other mass storage device. In an embodiment, the wireless transceiver 526 includes processing circuitry 132.

In at least one embodiment, FIG. 5 illustrates a system, which includes interconnected hardware devices or "chips." In at least one embodiment, FIG. 5 may illustrate an exemplary SoC. In at least one embodiment, devices illustrated in FIG. 5 may be interconnected with proprietary interconnects, standardized interconnects (e.g., PCIe), or some combination thereof. In at least one embodiment, one or more components of system 500 are interconnected using compute express link ("CXL") interconnects.

Other variations are within spirit of present disclosure. Thus, while disclosed techniques are susceptible to various modifications and alternative constructions, certain illustrated embodiments thereof are shown in drawings and have been described above in detail. It should be understood, however, that there is no intention to limit the disclosure to a specific form or forms disclosed, but on the contrary, the intention is to cover all modifications, alternative constructions, and equivalents falling within the spirit and scope of the disclosure, as defined in appended claims.

Use of terms "a" and "an" and "the" and similar referents in the context of describing disclosed embodiments (especially in the context of following claims) are to be construed to cover both singular and plural, unless otherwise indicated herein or clearly contradicted by context, and not as a definition of a term. Terms "comprising," "having," "including," and "containing" are to be construed as open-ended terms (meaning "including, but not limited to,") unless otherwise noted. "Connected," when unmodified and referring to physical connections, is to be construed as partly or wholly contained within, attached to, or joined together, even if there is something intervening. Recitations of ranges of values herein are merely intended to serve as a shorthand method of referring individually to each separate value falling within the range, unless otherwise indicated herein, and each separate value is incorporated into the specification as if it were individually recited herein. In at least one embodiment, the use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but subset and corresponding set may be equal.

Conjunctive language, such as phrases of the form "at least one of A, B, and C," or "at least one of A, B and C," unless specifically stated otherwise or otherwise clearly contradicted by context, is otherwise understood with the context as used in general to present that an item, term, etc., may be either A or B or C, or any nonempty subset of the set of A and B and C. For instance, in an illustrative example of a set having three members, conjunctive phrases "at least one of A, B, and C" and "at least one of A, B and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present. In addition, unless otherwise noted or contradicted by context, the term "plurality" indicates a state of being plural (e.g., "a plurality of items" indicates multiple items). In at least one embodiment, the number of items in a plurality is at least two, but can be more when so indicated either explicitly or by context. Further, unless stated otherwise or otherwise clear from context, the phrase "based on" means "based at least in part on" and not "based solely on."

Operations of processes described herein can be performed in any suitable order unless otherwise indicated herein or otherwise clearly contradicted by context. In at least one embodiment, a process such as those processes described herein (or variations and/or combinations thereof) is performed under control of one or more computer systems configured with executable instructions and is implemented as code (e.g., executable instructions, one or more computer programs or one or more applications) executing collectively on one or more processors, by hardware or combinations thereof. In at least one embodiment, code is stored on a computer-readable storage medium, for example, in the form of a computer program comprising a plurality of instructions executable by one or more processors. In at least one embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In at least one embodiment, code (e.g., executable code or source code) is stored on a set of one or more non-transitory computer-readable storage media having stored thereon executable instructions (or other memory to store executable instructions) that, when executed (i.e., as a result of being executed) by one or more processors of a computer system, cause a computer system to perform operations described herein. In at least one embodiment, a set of non-transitory computer-readable storage media comprises multiple non-transitory computer-readable storage media and one or more of individual non-transitory storage media of multiple non-transitory computer-readable storage media lack all of the code while multiple non-transitory computer-readable storage media collectively store all of the code. In at least one embodiment, executable instructions are executed such that different instructions are executed by different processors.

Accordingly, in at least one embodiment, computer systems are configured to implement one or more services that singly or collectively perform operations of processes described herein and such computer systems are configured with applicable hardware and/or software that enable the performance of operations. Further, a computer system that implements at least one embodiment of present disclosure is a single device and, in another embodiment, is a distributed computer system comprising multiple devices that operate differently such that distributed computer system performs operations described herein and such that a single device does not perform all operations.

Use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

All references, including publications, patent applications, and patents, cited herein are hereby incorporated by reference to the same extent as if each reference were individually and specifically indicated to be incorporated by reference and were set forth in its entirety herein.

In description and claims, terms "coupled" and "connected," along with their derivatives, may be used. It should be understood that these terms may not be intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout specification terms such as "processing," "computing," "calculating," "determining," or like, refer to action and/or processes of a computer or computing system, or similar electronic computing device, that manipulate and/or transform data represented as physical, such as electronic, quantities within computing system's registers and/or memories into other data similarly represented as physical quantities within computing system's memories, registers or other such information storage, transmission or display devices.

In a similar manner, the term "processor" may refer to any device or portion of a device that processes electronic data from registers and/or memory and transform that electronic data into other electronic data that may be stored in registers and/or memory. As non-limiting examples, a "processor" may be a network device or a MACsec device. A "computing platform" may comprise one or more processors. As used herein, "software" processes may include, for example, software and/or hardware entities that perform work over time, such as tasks, threads, and intelligent agents. Also, each process may refer to multiple processes, for carrying out instructions in sequence or in parallel, continuously or intermittently. In at least one embodiment, terms "system" and "method" are used herein interchangeably insofar as the system may embody one or more methods and methods may be considered a system.

In the present document, references may be made to obtaining, acquiring, receiving, or inputting analog or digital data into a subsystem, computer system, or computer-implemented machine. In at least one embodiment, the process of obtaining, acquiring, receiving, or inputting analog and digital data can be accomplished in a variety of ways such as by receiving data as a parameter of a function call or a call to an application programming interface. In at least one embodiment, processes of obtaining, acquiring, receiving, or inputting analog or digital data can be accomplished by transferring data via a serial or parallel interface. In at least one embodiment, processes of obtaining, acquiring, receiving, or inputting analog or digital data can be accomplished by transferring data via a computer network from providing entity to acquiring entity. In at least one embodiment, references may also be made to providing, outputting, transmitting, sending, or presenting analog or digital data. In various examples, processes of providing, outputting, transmitting, sending, or presenting analog or digital data can be accomplished by transferring data as an input or output parameter of a function call, a parameter of an application programming interface or inter-process communication mechanism.

Although descriptions herein set forth example embodiments of described techniques, other architectures may be used to implement described functionality, and are intended to be within the scope of this disclosure. Furthermore, although specific distributions of responsibilities may be defined above for purposes of description, various functions and responsibilities might be distributed and divided in different ways, depending on circumstances.

Furthermore, although the subject matter has been described in language specific to structural features and/or methodological acts, it is to be understood that subject matter claimed in appended claims is not necessarily limited to specific features or acts described. Rather, specific features and acts are disclosed as exemplary forms of implementing the claims.

What is claimed is:

1. A system comprising:
a processing device, operatively coupled to a memory, configured to:
receive signal data from a signal device;
preprocess the signal data to obtain preprocessed signal data having a data format for domain-specific processing by software executed by at least one processing unit of a processing platform; and
provide the preprocessed signal data for domain-specific processing by the software executed by the at least one processing unit.

2. The system of claim 1, wherein the signal data comprises analog signal data, wherein the processing device comprises an analog-to-digital converter, and wherein, to preprocess the signal data, the processing device is further configured to convert the analog signal data into digital signal data.

3. The system of claim 1, wherein, to preprocess the signal data, the processing device is further configured to perform at least one of:
de-serialize the signal data;
serialize the signal data;
packetize the signal data;
de-packetize the signal data; or
assign, to the signal data, a data identifier corresponding to a location for storing the signal data within the processing platform.

4. The system of claim 1, wherein, to preprocess the signal data, the processing device is further configured to structure the signal data into the data format by performing at least one of:

padding the signal data;
converting the signal data to a different format;
adapting the data format for processing by the software executed by the at least one processing unit.

5. The system of claim 1, wherein the system comprises a digital-over-fiber architecture that sends digitized signal data using packets.

6. The system of claim 1, wherein the system comprises an analog-over-fiber architecture that translates analog signal data into another domain.

7. The system of claim 1, wherein the processing platform is remote from the processing device, and wherein, to provide the preprocessed signal data for domain-specific processing by the software executed by the at least one processing unit, the processing device is configured to send the preprocessed data to the processing platform over a network connection.

8. The system of claim 7, wherein:
the network connection comprises at least one of: a Time-Sensitive Networking (TSN) Ethernet connection, a 5G Ultra-Reliable Low Latency Communications (URLLC) connection, or an IO-Link connection; and
the processing platform is synchronized with the processing device using at least one of: Precision Time Protocol (PTP) or Synchronous Ethernet (SyncE).

9. The system of claim 1, wherein the at least one processing unit comprises a data processing unit (DPU).

10. The system of claim 1, wherein the processing device is further configured to:
receive data from the processing platform;
convert the data into second signal data; and
provide the second signal data to the signal device for processing.

11. A system comprising:
a signal device comprising at least one of: a physical sensor, an actuator, a receiver, or a transmitter;
a processing device communicably coupled to the signal device; and
a processing platform communicably coupled to the processing device;
wherein the processing device, operatively coupled to a memory, is configured to:
receive signal data from the signal device;
preprocess the signal data to obtain preprocessed signal data having a data format for domain-specific processing by software executed by at least one processing unit of the processing platform; and
provide the preprocessed signal data for domain-specific processing by the software executed by the at least one processing unit.

12. The system of claim 11, wherein the signal data comprises analog signal data, wherein the processing device comprises an analog-to-digital converter, and wherein, to preprocess the signal data, the processing device is further configured to convert the analog signal data into digital signal data.

13. The system of claim 11, wherein, to preprocess the signal data, the processing device is further configured to perform at least one of:
de-serialize the signal data;
serialize the signal data;
de-packetize the signal data;
packetize the signal data; or
assign, to the signal data, a data identifier corresponding to a location for storing the signal data within the processing platform.

14. The system of claim 11, wherein, to preprocess the signal data, the processing device is further configured to structure the signal data into the data format by performing at least one of:
padding the signal data;
converting the signal data to a different format; or
adapting the data format for processing by the software executed by the at least one processing unit.

15. The system of claim 11, wherein the system comprises:
a digital-over-fiber architecture that sends digitized signal data using packets; or
an analog-over-fiber architecture that translates analog signal data into another domain.

16. The system of claim 11, wherein:
the processing platform is remote from the processing device;
to provide the preprocessed signal data for domain-specific processing by the software executed by the at least one processing unit, the processing device is configured to send the preprocessed data to the processing platform over a network connection;
the processing platform is synchronized with the system using at least one of: Precision Time Protocol (PTP) or Synchronous Ethernet (SyncE); and
the network connection comprises at least one of: a Time-Sensitive Networking (TSN) Ethernet connection, a 5G Ultra-Reliable Low Latency Communications (URLLC) connection, or an IO-Link connection.

17. The system of claim 11, wherein the processing platform is an edge processing platform.

18. The system of claim 11, wherein the at least one processing unit comprises a data processing unit (DPU).

19. The system of claim 11, wherein the processing device is further configured to:
receive data from the processing platform;
convert the data into second signal data; and
provide the second signal data to the signal device for processing.

20. A method comprising:
receiving, by a processing device, signal data from a signal device;
preprocessing, by the processing device, the signal data to obtain preprocessed signal data having a data format for domain-specific processing by software executed by at least one processing unit of a processing platform; and
sending, by the processing device, the preprocessed signal data for domain-specific processing by the software executed by the at least one processing unit.

* * * * *